United States Patent
Petrucci et al.

(10) Patent No.: US 9,274,156 B2
(45) Date of Patent: Mar. 1, 2016

(54) ANTENNA MAST DETECTION METHODS AND SYSTEMS

(71) Applicant: GM GLOBAL TECHNOLOGY OPERATIONS LLC, Detroit, MI (US)

(72) Inventors: David R. Petrucci, Warren, MI (US); Gregg R. Kittinger, Pontiac, MI (US); Duane S. Carper, Davison, MI (US); Douglas C. Martin, Oxford, MI (US); Laurence G. Ekstrom, Madison Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 264 days.

(21) Appl. No.: 13/868,783

(22) Filed: Apr. 23, 2013

(65) Prior Publication Data

US 2014/0055320 A1    Feb. 27, 2014

Related U.S. Application Data

(60) Provisional application No. 61/693,094, filed on Aug. 24, 2012.

(51) Int. Cl.
  *H01Q 1/12* (2006.01)
  *H01Q 1/32* (2006.01)
  *G01R 31/00* (2006.01)

(52) U.S. Cl.
  CPC ............... *G01R 31/006* (2013.01); *H01Q 1/12* (2013.01); *H01Q 1/1214* (2013.01); *H01Q 1/3275* (2013.01)

(58) Field of Classification Search
  CPC . H01Q 1/3275; H01Q 1/3233; G01R 19/145; G01R 19/155; G01R 29/12
  USPC ............ 343/711–717, 894, 77, 941; 340/567, 340/568.1, 657–664, 539.24, 635, 649, 652, 340/653, 686.4, 687, 693.5
  See application file for complete search history.

(56) References Cited

U.S. PATENT DOCUMENTS

| | | | |
|---|---|---|---|
| 4,137,521 A * | 1/1979 | Martinez | 340/426.34 |
| 4,293,860 A * | 10/1981 | Iwata | 343/715 |
| 5,943,609 A | 8/1999 | Ericson et al. | |
| 6,275,194 B1 * | 8/2001 | Ansorge | 343/713 |
| 6,509,878 B1 * | 1/2003 | Tornatta et al. | 343/715 |
| 2004/0257284 A1 * | 12/2004 | Rada et al. | 343/702 |
| 2005/0085951 A1 | 4/2005 | Walker et al. | |
| 2006/0094368 A1 | 5/2006 | Lee et al. | |

(Continued)

FOREIGN PATENT DOCUMENTS

| CN | 101741482 A | 6/2010 |
|---|---|---|
| CN | 202134651 U | 2/2012 |

OTHER PUBLICATIONS

Petrucci, David R., US Patent Application, entitled "Antenna Mast Detection Methods and Systems," filed on Apr. 23, 2013.

(Continued)

*Primary Examiner* — Robert Karacsony
*Assistant Examiner* — Daniel J Munoz
(74) *Attorney, Agent, or Firm* — Ingrassia Fisher & Lorenz, P.C.

(57) ABSTRACT

An antenna is provided. The antenna includes an antenna base; and a detection mechanism removably coupled to the antenna base that generates a detection signal for detecting whether an antenna mast is coupled to the antenna base.

17 Claims, 4 Drawing Sheets

(56) References Cited

U.S. PATENT DOCUMENTS

| | | |
|---|---|---|
| 2006/0214854 A1 | 9/2006 | Ukai |
| 2006/0273956 A1 | 12/2006 | Kondo |
| 2008/0198077 A1 | 8/2008 | Duzdar et al. |
| 2011/0287820 A1 | 11/2011 | Harrison et al. |

OTHER PUBLICATIONS

USPTO, Office Action for U.S. Appl. No. 13/868,832 mailed Apr. 10, 2015.

State Intellectual Property Office of the People's Republic of China, Office Action for Chinese Patent Application No. 201310372784.6 mailed May 5, 2015.

State Intellectual Property Office of the People'S Republic of China, Office Action in Chinese Patent Application No. 201310372784.6 mailed Dec. 28, 2015.

USPTO, Notice of Allowance and Fee(s) due for U.S. Appl. No. 13/868,810 mailed Jan. 7, 2016.

* cited by examiner

ANTENNA MAST DETECTION METHODS AND SYSTEMS

CROSS-REFERENCE TO RELATED APPLICATION

This application claims the benefit of U.S. provisional patent application Ser. No. 61/693,094, filed Aug. 24, 2012, which is hereby incorporated by reference in its entirety.

TECHNICAL FIELD

The technical field generally relates to vehicle antennas, and more particularly relates to methods and systems for detecting the installation of an antenna mast on the vehicle.

BACKGROUND

Some vehicle antennas are installed by a dealer after production and prior to delivering the vehicle to a customer. These antennas include antenna masts that couple to an antenna receiver of the vehicle. The antenna mast is typically loose shipped with the vehicle. A removable shipping cap is placed on the loose shipped antenna mast to protect antenna threads that couple to the receiver.

In some cases, the dealer can forget to install the antenna mast before delivering the vehicle to the customer. In other cases, the assembly plant does not include the antenna mast with the vehicle as received at the dealership, therefore the dealer does not install the antenna mast.

Accordingly, it is desirable to provide methods and systems for detecting the installation of the antenna mast. In addition, it is desirable to provide methods and systems for detecting whether the installation of the antenna mast was correct. Furthermore, other desirable features and characteristics of the present invention will become apparent from the subsequent detailed description and the appended claims, taken in conjunction with the accompanying drawings and the foregoing technical field and background.

SUMMARY

Accordingly, an antenna is provided. The antenna includes an antenna base; and a detection mechanism removably coupled to the antenna base that generates a detection signal for detecting whether an antenna mast is coupled to the antenna base.

DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
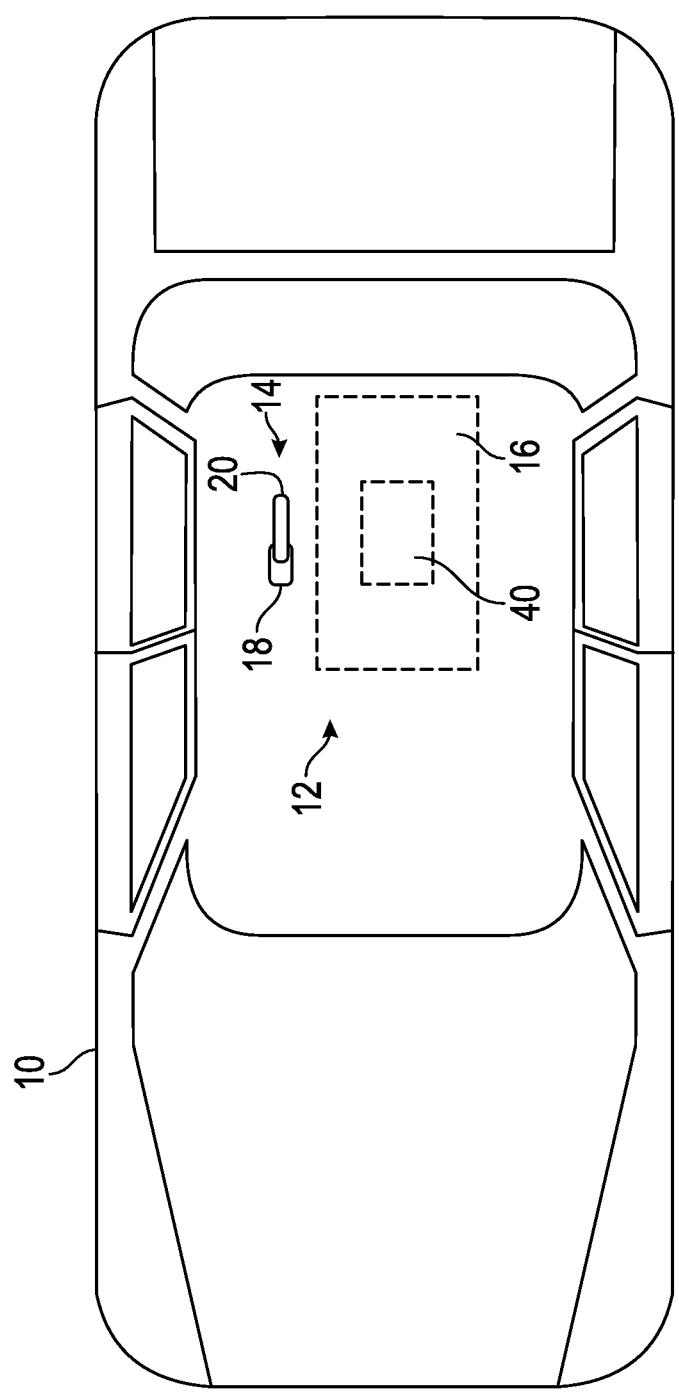
FIG. 1 is a diagram of a vehicle including an antenna monitoring system in accordance with various embodiments.

The following detailed description is merely exemplary in nature and is not intended to limit the application and uses. Furthermore, there is no intention to be bound by any expressed or implied theory presented in the preceding technical field, background, brief summary or the following detailed description. It should be understood that throughout the drawings, corresponding reference numerals indicate like or corresponding parts and features. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Referring now to FIG. 1, a vehicle 10 is shown having an antenna monitoring system shown generally at 12 in accordance with various embodiments. Although the figures shown herein depict an example with certain arrangements of elements, additional intervening elements, devices, features, or components may be present in an actual embodiments. It should also be understood that FIG. 1 is merely illustrative and may not be drawn to scale.

In FIG. 1, the vehicle monitoring system 10 is shown to include an antenna shown generally at 14 communicatively coupled to an infotainment system 16. The antenna 14, when completely installed to the vehicle 10, includes an antenna base 18 and an antenna mast 20. As can be appreciated, the antenna 14 can be any antenna type including, but not limited to, AM FM or multi-band antennas that include AM FM content. For exemplary purposes, the disclosure will be discussed in the context of a hexband antenna 14.

Figure 2:
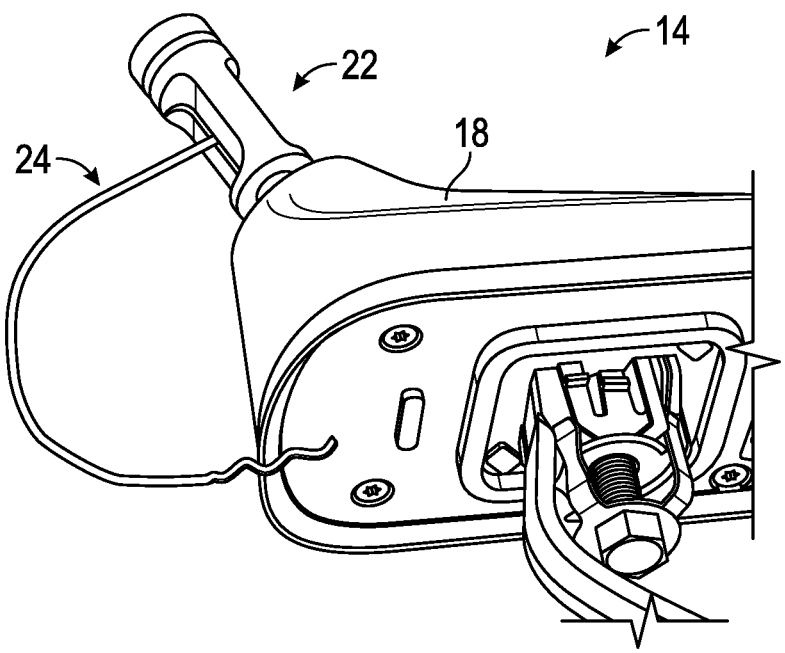
FIG. 2 is a perspective view of an antenna of the antenna system having a shipping cap installed in accordance with various embodiments.

As shown in FIG. 2, prior to complete installation into the vehicle 10, a shipping cap 24 is removably coupled to the antenna base 18. When completing the installation of the antenna 14 to the vehicle 10, the shipping cap 22 is removed from the antenna base 18, and is replaced with the antenna mast 20 as shown in FIG. 3.

Figure 3:
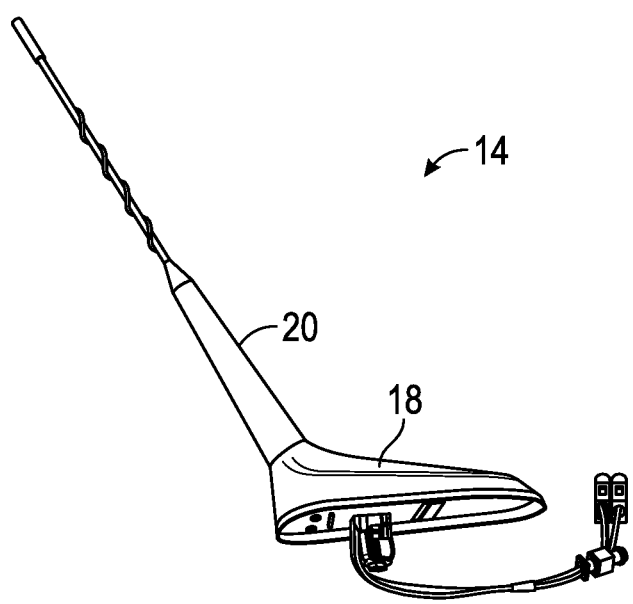
FIG. 3 is a perspective view of an antenna of the antenna system having an antenna mast installed in place of the shipping cap in accordance with various embodiments.

As further shown in FIG. 2, the antenna 14 includes a detection mechanism shown generally at 24 for assisting in the detection of the installation of the antenna mast 20 (FIG. 3). The detection mechanism 24 is shown to be integrated with the shipping cap 22. As can be appreciated, in various other embodiments (not shown), the detection mechanism is implemented separate from the shipping cap 22 and/or installed in place of the shipping cap 22.

In various embodiments, the detection mechanism 24 is a radio frequency (RF) device. As shown in more detail in FIGS. 4A and 4B, the RF device includes a plunger 26 that is disposed partially within a plunger body 28. The plunger 26 is movable within the plunger body 28 between a first depressed position and 30 a second released position 32.

The detection mechanism 24 further includes a shunt element 34 that movably couples to and extends from the plunger body 28. When the shipping cap 22 is installed to the antenna base 18, the shunt element 34 couples to a ground element (e.g., of the vehicle chassis) through the antenna base 18 (as shown in FIG. 2).

Figure 4A:
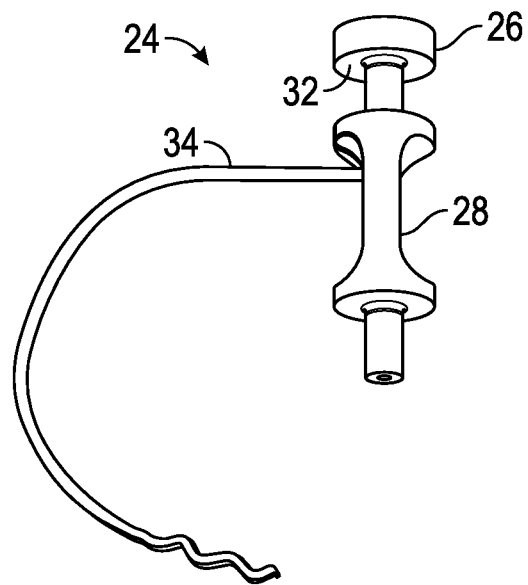
FIGS. 4A and 4B are side perspective views of the shipping cap in accordance with various embodiments.
Figure 4B:
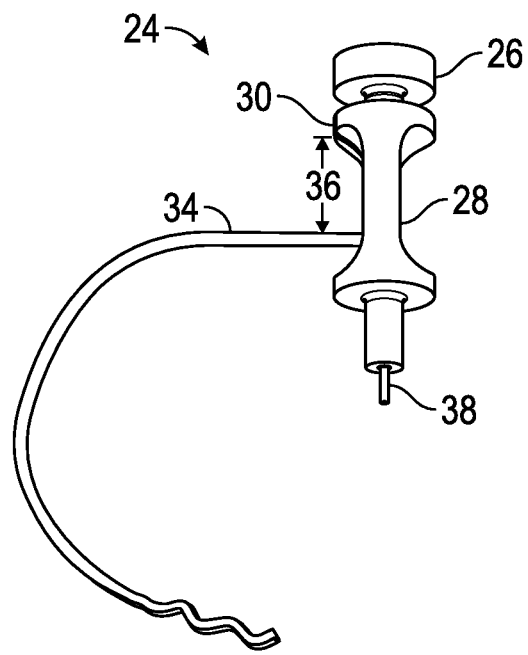

In various embodiments, a portion of the shunt element 34 extends through the plunger body 28 and slides along a first axis 36 (i.e., parallel to the plunger body 28) from a first position to a second position. When the plunger 26 is in the first depressed position 30 (as shown in FIG. 4B), the shunt element 34 is in the first position and making contact with an electrical contact or line 38 of the shipping cap 22. When the contact is made, a no signal condition is created. When the plunger 26 is in the second released position 32 (as shown in FIG. 4A), the shunt element 34 is in the second position separated from any contact with the electrical line 38 (cable) of the shipping cap 22. When no contact is made, a signal enable condition is created.

With reference back to FIG. 1, the infotainment system 16 includes an antenna monitoring module 40. In various other embodiments (not shown), the antenna monitoring module 40 communicates with (e.g., through a vehicle communication bus (not shown)) but is not part of the infotainment system 16. The antenna monitoring module 40 communicates with the antenna 14 to determine if the antenna mast 20 has been installed and/or whether the antenna mast 20 has been damaged.

Figure 5:
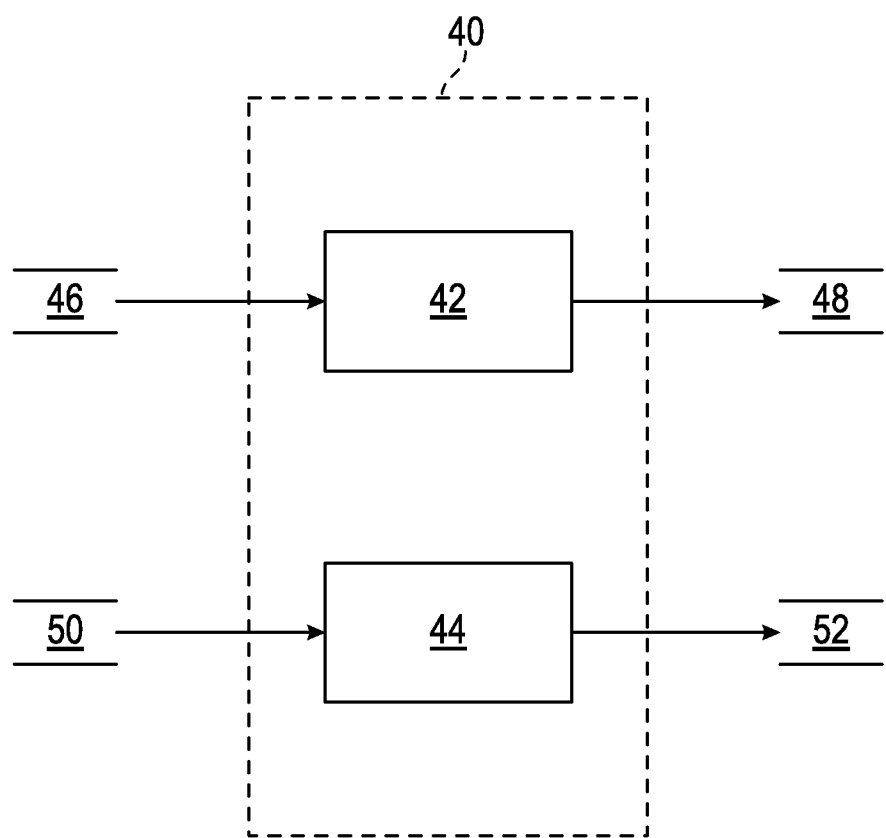
FIG. 5 is a dataflow diagram illustrating an antenna mast monitoring module in accordance with various embodiments.

Referring now to FIG. 5 and with continued reference to FIGS. 1-3, and 4A-4B, a dataflow diagram illustrates various embodiments of the antenna monitoring module 40 of the antenna monitoring system 12. Various embodiments of antenna monitoring modules 40 according to the present disclosure may include any number of sub-modules. As can be appreciated, the sub-modules shown in FIG. 5 may be combined and/or further partitioned to similarly monitor the antenna 14. Inputs to the antenna monitoring module 40 may be received from sensors, may be received from other modules that process sensed data, and or may be received from other control modules within the vehicle 10. In various embodiments, the antenna monitoring module 40 includes a mast detection module 42, and a mast health monitoring module 44.

The mast detection module 42 monitors various antenna data 46 to detect whether the antenna mast 20 has been installed. The mast detection module 42 generates warning signals 48 based on the monitoring. The warning signals 48 may be used to set a fault code of the vehicle 10, to illuminate a warning lamp of the vehicle 10, to generate an audible warning within the vehicle 10, and/or to display a warning message in the infotainment system 16 or other display system of the vehicle 10. In various embodiments, the monitoring methods performed by the mast detection module 42 may be performed as a scheduled test prior to delivery of the vehicle 10.

The mast health monitoring module 44 monitors various antenna data 50 to detect the health of the antenna including the antenna mast 20, cable, and cable connections. The mast health monitoring module 44 generates warning signals 52 based on the monitoring. The warning signals 52 may be used to set a fault code of the vehicle 10, to illuminate a warning lamp of the vehicle 10, to generate an audible warning within the vehicle 10, and/or to display a warning message in the infotainment system 16 or other display system of the vehicle 10. In various embodiments, the monitoring methods performed by the mast health monitoring module 44 may be performed as a scheduled test prior to delivery of the vehicle 10 and/or as a periodic test during operation of the vehicle 10 to detect a damaged antenna mast, or to detect whether the mast has been removed.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. An antenna, comprising: an antenna base; and a detection mechanism that removably couples to the antenna base in place of an antenna mast, the detection mechanism configured to generate a detection signal for detecting whether the antenna mast is coupled to the antenna base.

2. The antenna of claim 1, wherein the detection mechanism is a radio frequency (RF) device.

3. The antenna of claim 2, wherein the RF device includes a plunger that is partially disposed within a plunger body, and that is movable within the plunger body between a first position and a second position.

4. The antenna of claim 3, wherein the RF device further includes shunt mechanism that couples to the plunger body and to a ground element and that is movable with the plunger.

5. The antenna of claim 4, wherein the ground element is of the antenna base.

6. The antenna of claim 5, wherein the ground element of the antenna base couples to a vehicle chassis.

7. The antenna of claim 4, wherein the shunt element creates a signal enable condition when the plunger is in the second position.

8. The antenna of claim 5, wherein the RF device includes at least one of an electrical contact and an electrical line, and wherein the shunt element creates the signal enable condition when the shunt element is not in contact with the at least one of the electrical contact and the electrical line.

9. The antenna of claim 4, wherein the shunt element creates a no signal condition when the plunger is in the first position.

10. The antenna of claim 9, wherein the RF device includes at least one of an electrical contact and an electrical line, and wherein the shunt element creates the no signal condition when the shunt element is in contact with the at least one of the electrical contact and the electrical line.

11. The antenna of claim 1, wherein the detection mechanism is integrated with a shipping cap.

12. The antenna of claim 1, wherein the detection mechanism is separate from a shipping cap.

13. The antenna of claim 1, wherein the antenna base couples to a vehicle.

14. The antenna of claim 1, further comprising an infotainment system that receives the detection signal and that selectively detects whether the detection mechanism is installed to the antenna base based on the detection signal.

15. The antenna of claim 1, wherein the detection signal is an amplitude modulation band signal.

16. The antenna of claim 1, wherein the detection signal is a direct current power signal.

17. The antenna of claim 1, wherein the detection signal is a voltage standing wave radio signal.

* * * * *